United States Patent
Zeng et al.

(10) Patent No.: US 11,107,871 B2
(45) Date of Patent: Aug. 31, 2021

(54) AMOLED DISPLAY PANEL AND CORRESPONDING DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Mian Zeng, Hubei (CN); Liang Sun, Hubei (CN); Shoucheng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 473 days.

(21) Appl. No.: 16/307,489

(22) PCT Filed: Sep. 21, 2018

(86) PCT No.: PCT/CN2018/107116
§ 371 (c)(1),
(2) Date: Dec. 6, 2018

(87) PCT Pub. No.: WO2020/047912
PCT Pub. Date: Mar. 12, 2020

(65) Prior Publication Data
US 2021/0225974 A1    Jul. 22, 2021

(30) Foreign Application Priority Data
Sep. 7, 2018   (CN) .......................... 201811040801.5

(51) Int. Cl.
G09G 3/30    (2006.01)
H01L 27/32   (2006.01)
(Continued)

(52) U.S. Cl.
CPC ....... *H01L 27/3262* (2013.01); *G09G 3/3233* (2013.01); *H01L 27/3276* (2013.01);
(Continued)

(58) Field of Classification Search
CPC ............ H01L 27/3262; H01L 27/3276; G09G 3/3233; G09G 3/32; G09G 3/30; G09G 3/34; G09G 3/36; G09G 5/00; G06F 3/038
See application file for complete search history.

(56) References Cited

U.S. PATENT DOCUMENTS 10,325,546 B2 *   6/2019   Zhang ................ G09G 3/3225
2014/0084932 A1 * 3/2014   Chaji ................. G09G 3/3233
                                                            324/414
(Continued)

FOREIGN PATENT DOCUMENTS

CN   102385200 A   3/2012
CN   202421684 U   9/2012
(Continued)

*Primary Examiner* — Pegeman Karimi
(74) *Attorney, Agent, or Firm* — Soroker Agmon Nordman

(57) ABSTRACT

The present disclosure provides an active-matrix organic light-emitting diode (AMOLED) display panel and a display device. The AMOLED display panel includes a plurality of first pixel units and a plurality of second pixel units. The first pixel unit includes a first sub-pixel and a second sub-pixel. The present disclosure is achieved by the first sub-pixel and the second sub-pixel in the first pixel unit to share one of the data lines, and by another first sub-pixel and a third sub-pixel in the second pixel unit to share one of the data lines, such that a quantity of data lines and a quantity of fan-out wires are reduced, so as to reduce a size of a lower bezel.

16 Claims, 7 Drawing Sheets

(51) Int. Cl.
*G09G 3/3233* (2016.01)
*H01L 27/12* (2006.01)
(52) U.S. Cl.
CPC .. *G09G 2300/0439* (2013.01); *H01L 27/1222* (2013.01); *H01L 27/3265* (2013.01)

(56) References Cited

U.S. PATENT DOCUMENTS

| | | | | |
|---|---|---|---|---|
| 2014/0168194 | A1* | 6/2014 | Kong | H01L 29/78645 345/212 |
| 2017/0004757 | A1* | 1/2017 | Yata | G09G 3/3233 |
| 2017/0132965 | A1 | 5/2017 | Hsu | |
| 2017/0221419 | A1* | 8/2017 | Xiang | G09G 3/3233 |
| 2019/0164502 | A1* | 5/2019 | Yoon | H01L 27/3216 |

FOREIGN PATENT DOCUMENTS

| | | | |
|---|---|---|---|
| CN | 104835451 | A | 8/2015 |
| CN | 107479766 | A | 12/2017 |
| KR | 20110100930 | A | 9/2011 |

\* cited by examiner

AMOLED DISPLAY PANEL AND CORRESPONDING DISPLAY DEVICE

FIELD OF INVENTION

The present disclosure relates to the technical field of displays, and in particular, to an active-matrix organic light-emitting diode (AMOLED) display panel and a corresponding display device.

BACKGROUND OF INVENTION

With development of display industry technologies, requirements of customers for display panels are increasingly high. For example, for some high-end display panels, customers require that a narrow bezel is designed. The current active-matrix organic light-emitting diode (AMOLED) display panel includes a display area C1 configured to set a pixel structure, a binding area C2 configured to place a chip on film (COF) or a chip binding area configured to place a chip on plastic (COP), a fan-out area C3 connected to "Data" signals in a pixel circuit of the display area C1 and a bending area C4 for bending. The binding area is bent to a location below the panel by bending the bending area C4, and a lower bezel of original rigid display panel may be diminished, as shown FIG. 1.

In the current design, a value of a distance D from the display area C1 to the bending area C4 is still relatively large. A main reason is that a wiring space of the fan-out area C3 requires to be considered, and a height required for the current fan-out area C3 is mainly affected by factors, such as a quantity of fan-out wires. That is, when the quantity of wires is relatively small, the height required for the fan-out area C3 may be reduced.

In the current AMOLED display panel, "Pentile" pixel arrangement is used. As shown in FIG. 2, a structure of the pixel arrangement includes a pixel 1 obtained by combining two sub-pixels, namely, a red sub-pixel and a green sub-pixel, and a pixel 2 obtained by combining two sub-pixels, namely, a blue sub-pixel and a green sub-pixel. The two pixels share neighboring sub-pixels and form repeating units arranged in an array manner. The repeating units are arranged along a row direction. Moreover, a direction of a short side of each sub-pixel is consistent with the row direction, and a direction of a long side of each sub-pixel is consistent with a column direction, such that each pixel requires two "Data" signal lines (data line) and one "Scan" signal line (gate line), so as to increase the quantity of fan-out wires and increase the height required for the fan-out area.

SUMMARY OF INVENTION

Embodiments of the present disclosure provide an active-matrix organic light-emitting diode (AMOLED) display panel and a corresponding display device, in which a quantity of data lines is reduced. That is to reduce a quantity of fan-out wires and reduce a height of a fan-out area, to resolve a technical problem that a "Pentile" pixel arrangement design is used in the current AMOLED display panel and each pixel requires two data lines, causing an increase in the quantity of fan-out wires and an increase in the height required for the fan-out area.

An embodiment of the present disclosure provides an AMOLED display panel, which includes a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit includes a first sub-pixel and a second sub-pixel disposed side by side with the first sub-pixel; wherein the second pixel unit includes another first sub-pixel and a third sub-pixel disposed side by side with the another first sub-pixel; wherein the first pixel unit and the third sub-pixel adjacent to the second pixel unit constitute a pixel point, and the second pixel unit and a second sub-pixel adjacent to the first pixel unit constitute a pixel point;

wherein the pixel structure includes a plurality of data lines connected to the sub-pixels;

wherein in the first pixel unit, the first sub-pixel and the second sub-pixel are arranged along a direction in which the data lines extend, and the first sub-pixel and the second sub-pixel share one of the data lines; wherein in the second pixel unit, the first sub-pixel and the third sub-pixel are arranged along the direction in which the data lines extend, and the first sub-pixel and the third sub-pixel share one of the data lines;

wherein the first sub-pixel, the second sub-pixel, and the third sub-pixel are rectangular and have areas in equal, and a direction extending along a long side of each of the first sub-pixel, the second sub-pixel, and the third sub-pixel is perpendicular to the direction in which the data lines extend; and wherein the pixel structure includes a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

In the AMOLED display panel of the present disclosure, the pixel circuit is a 7T1C pixel circuit, and the 7T1C pixel circuit includes a driving transistor configured to determine driving current of a driving circuit, wherein the driving transistor includes a linear first active layer and a linear first gate disposed on the first active layer, the first active layer includes a channel area overlapped with the first gate, and the channel area is linear.

In the AMOLED display panel of the present disclosure, the 7T1C pixel circuit includes a capacitor for voltage compensation, the capacitor includes a straight-strip-shaped lower electrode plate and a straight-strip-shaped upper electrode plate located over the straight-strip-shaped lower electrode plate, and the first gate is a portion of the straight-strip-shaped lower electrode plate.

In the AMOLED display panel of the present disclosure, the pixel circuit is a 7T1C pixel circuit, and the 7T1C pixel circuit includes a transistor configured to control a reference signal VI transmitted to a control end of the driving transistor;

wherein the transistor includes a U-shaped second active layer and an oblique-line-shaped second gate disposed on the second active layer, the second active layer includes two strip-shaped portions disposed in parallel, the second gate overlaps with the two strip-shaped portions, the second active layer includes a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

An embodiment of the present disclosure provides another AMOLED display panel, which includes a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit includes a first sub-pixel and a second sub-pixel disposed side by side with the first sub-pixel; wherein the second pixel unit includes another first sub-pixel and a third sub-pixel disposed side by side with the another first sub-pixel; wherein the first pixel unit and the third sub-pixel adjacent to the second pixel unit constitute a pixel point, and the second pixel unit and a second sub-pixel adjacent to the first pixel unit constitute a pixel point;

wherein the pixel structure further includes a plurality of data lines connected to the sub-pixels; wherein in the first pixel unit, the first sub-pixel and the second sub-pixel are arranged along a direction in which the data lines extend, and the first sub-pixel and the second sub-pixel share one of the data lines; and wherein in the second pixel unit, the first sub-pixel and the third sub-pixel are arranged along the direction in which the data lines extend, and the first sub-pixel and the third sub-pixel share one of the data lines.

In the another AMOLED display panel of the present disclosure, the first sub-pixel, the second sub-pixel, and the third sub-pixel are rectangular and have areas in equal, and a direction extending along a long side of each of the first sub-pixel, the second sub-pixel, and the third sub-pixel is perpendicular to the direction in which the data lines extend.

In the another AMOLED display panel of the present disclosure, the pixel structure includes a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

In the another AMOLED display panel of the present disclosure, the pixel circuit is a 7T1C pixel circuit, and the 7T1C pixel circuit includes a driving transistor configured to determine driving current of a driving circuit;

wherein the driving transistor includes a linear first active layer and a linear first gate disposed on the first active layer, the first active layer includes a channel area overlapped with the first gate, and the channel area is linear.

In the another AMOLED display panel of the present disclosure, the 7T1C pixel circuit includes a capacitor for voltage compensation, the capacitor includes a straight-strip-shaped lower electrode plate and a straight-strip-shaped upper electrode plate located over the straight-strip-shaped lower electrode plate, and the first gate is a portion of the straight-strip-shaped lower electrode plate.

In the another AMOLED display panel of the present disclosure, the pixel circuit is a 7T1C pixel circuit, and the 7T1C pixel circuit includes a transistor configured to control a reference signal VI transmitted to a control end of the driving transistor;

wherein the transistor includes a U-shaped second active layer and an oblique-line-shaped second gate disposed on the second active layer, the second active layer includes two strip-shaped portions disposed in parallel, the second gate overlaps with the two strip-shaped portions, the second active layer includes a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

In the another AMOLED display panel of the present disclosure, the first sub-pixel is a green sub-pixel, the second sub-pixel is a blue sub-pixel, and the third sub-pixel is a red sub-pixel.

The present disclosure further relates to a display device including an AMOLED display panel, which includes a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit includes a first sub-pixel and a second sub-pixel disposed side by side with the first sub-pixel; wherein the second pixel unit includes another first sub-pixel and a third sub-pixel disposed side by side with the another first sub-pixel; wherein the first pixel unit and the third sub-pixel adjacent to the second pixel unit constitute a pixel point, and the second pixel unit and a second sub-pixel adjacent to the first pixel unit constitute a pixel point; and wherein the pixel structure further includes a plurality of data lines connected to the sub-pixels. In the first pixel unit, the first sub-pixel and the second sub-pixel are arranged along a direction in which the data lines extend, and the first sub-pixel and the second sub-pixel share one of the data lines, and in the second pixel unit, the first sub-pixel and the third sub-pixel are arranged along the direction in which the data lines extend, and the first sub-pixel and the third sub-pixel share one of the data lines.

In the display device of the present disclosure, the first sub-pixel, the second sub-pixel, and the third sub-pixel are rectangular and have areas in equal. An extending direction of a long side of each of the first sub-pixel, the second sub-pixel and the third sub-pixel is perpendicular to the extending direction of the data lines.

In the display device of the present disclosure, the pixel structure includes a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

In the display device of the present disclosure, the pixel circuit is a 7T1C pixel circuit, and the 7T1C pixel circuit includes a driving transistor configured to determine driving current of a driving circuit;

wherein the driving transistor includes a linear first active layer and a linear first gate disposed on the first active layer, the first active layer includes a channel area overlapped with the first gate, and the channel area is linear.

In the display device of the present disclosure, the 7T1C pixel circuit includes a capacitor for voltage compensation, the capacitor includes a straight-strip-shaped lower electrode plate and a straight-strip-shaped upper electrode plate located over the straight-strip-shaped lower electrode plate, and the first gate is a portion of the straight-strip-shaped lower electrode plate.

In the display device of the present disclosure, the pixel circuit is a 7T1C pixel circuit, and the 7T1C pixel circuit includes a transistor configured to control a reference signal VI transmitted to a control end of the driving transistor;

wherein the transistor includes a U-shaped second active layer and an oblique-line-shaped second gate disposed on the second active layer, the second active layer includes two strip-shaped portions disposed in parallel, the second gate overlaps with the two strip-shaped portions, the second active layer includes a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

Compared with AMOLED display panels in the prior art, the AMOLED display panel and the corresponding display device of the present disclosure are implemented by the first sub-pixel and the second sub-pixel in the first pixel unit share one of the data lines, and the first sub-pixel and the third sub-pixel in the second pixel unit share one of the data lines, such that a quantity of data lines is reduced, thereby reducing a quantity of fan-out wires, and reducing a space required by wiring in a fan-out area, so as to reduce a size of a lower bezel.

Additionally, when the 7T1C pixel circuit is configured to drive the sub-pixel, the channel area of the driving transistor is linear, thereby reducing a process difficulty. The first channel area and the second channel area of the transistor configured to control the reference signal VI transmitted to a control end of the driving transistor are oblique-line-shaped, thereby increasing an effective length of the channel area and reducing a leakage current. It resolves a technical problem that a "Pentile" pixel arrangement design used in the current AMOLED display panel, in which each pixel requires two data lines, that causes an increase in the quantity of fan-out wires and increases an height required for the fan-out area.

BRIEF DESCRIPTION OF DRAWINGS

In order to illustrate the technical solutions in the embodiments of the present disclosure or in the prior art more clearly, the accompanying drawings required in the embodiments are briefly described in the following. The drawings in the following description are only partial embodiments of the present disclosure, and those skilled in the art can obtain other drawings according to the drawings without any creative work.

DETAILED DESCRIPTION OF PREFERRED EMBODIMENTS

With reference to figures in the accompanying drawings, a same component symbol represents a same component. The following description is based on exemplified specific embodiments of the present disclosure, and the embodiments should not be considered to limit other specific embodiments of the present disclosure that are not detailed herein.

Figure 3:
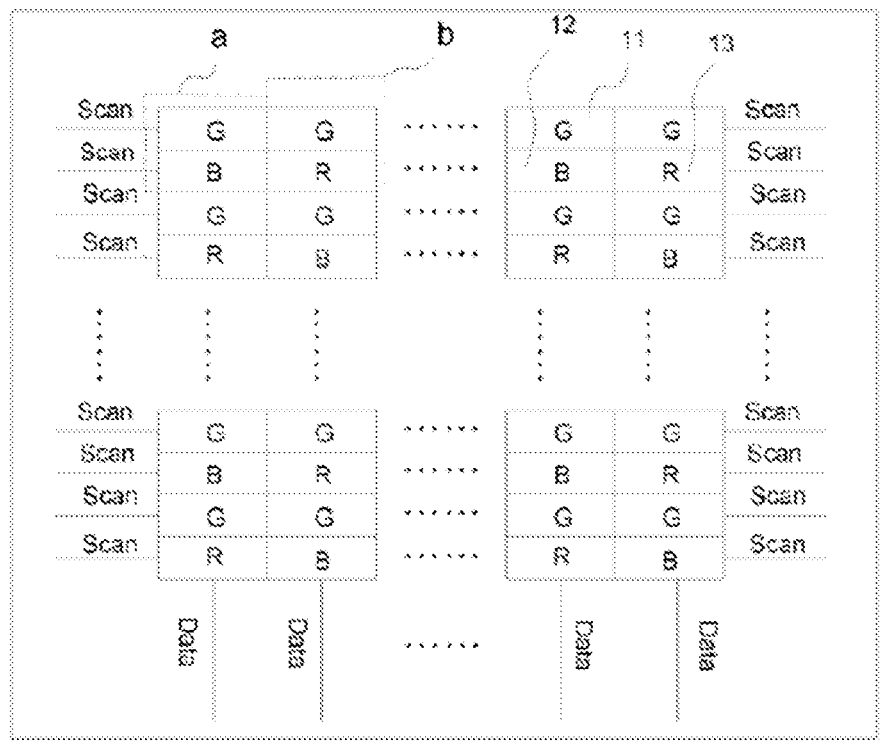
FIG. 3 is a schematic diagram of arrangement of a pixel structure of an embodiment of an AMOLED display panel according to the present disclosure.

Referring to FIG. 3, which is a schematic diagram of arrangement of a pixel structure of an embodiment of an active-matrix organic light-emitting diode (AMOLED) display panel according to the present disclosure.

The AMOLED display panel of the present embodiment includes a plurality of first pixel units 10 and a plurality of second pixel units 20. The first pixel units 10 and the second pixel units 20 are alternately disposed along a horizontal direction and along a vertical direction to form a pixel structure arranged in a matrix manner.

The first pixel unit a includes a first sub-pixel 11 and a second sub-pixel 12 disposed side by side with the first sub-pixel 11. The second pixel unit b includes another first sub-pixel 11 and a third sub-pixel 13 disposed side by side with the another first sub-pixel 11. The first pixel unit a and a third sub-pixel 13 adjacent to the second pixel unit b constitute a pixel point. The second pixel unit b and a second sub-pixel 12 adjacent to the first pixel unit a constitute a pixel point.

The pixel structure further includes a plurality of data lines Data connected to sub-pixels. In the first pixel unit a, the first sub-pixel 11 and the second sub-pixel 12 are arranged along a direction in which the data lines Data extend. The first sub-pixel 11 and the second sub-pixel 12 share one of the data lines Data. In the second pixel unit b, the first sub-pixel 11 and the third sub-pixel 13 are arranged along the direction in which the data lines Data extend. The first sub-pixel 11 and the third sub-pixel 13 share one of data lines Data.

A sub-pixel includes a light-emitting device unit and a corresponding pixel driving circuit unit. In the present embodiment, a disposition of side by side between sub-pixels is essentially a disposition of side by side between pixel driving circuit units.

Figure 1:
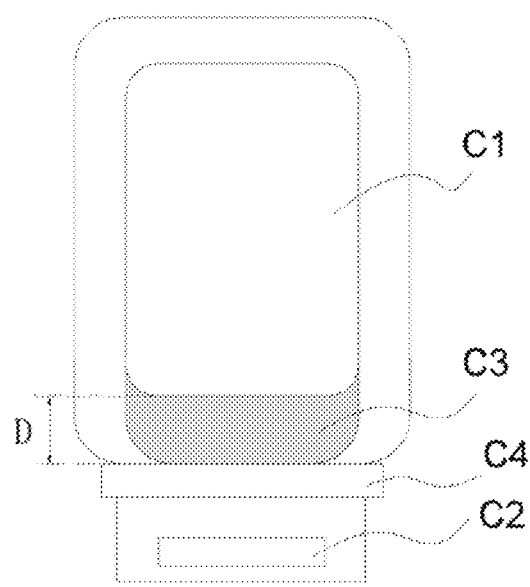
FIG. 1 is a schematic diagram of a structure of an active-matrix organic light-emitting diode (AMOLED) display panel in the prior art.
Figure 2:
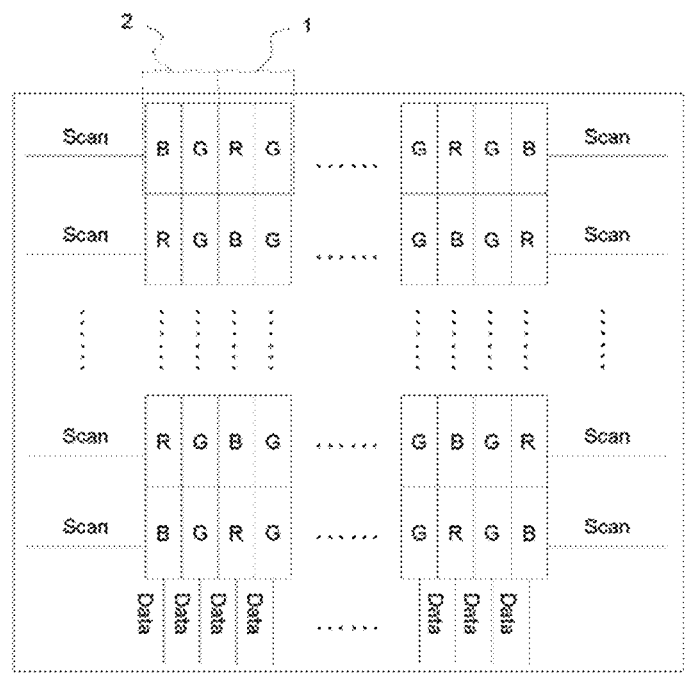
FIG. 2 is a schematic diagram of arrangement of a pixel structure of an AMOLED display panel in the prior art.
Figure 6:
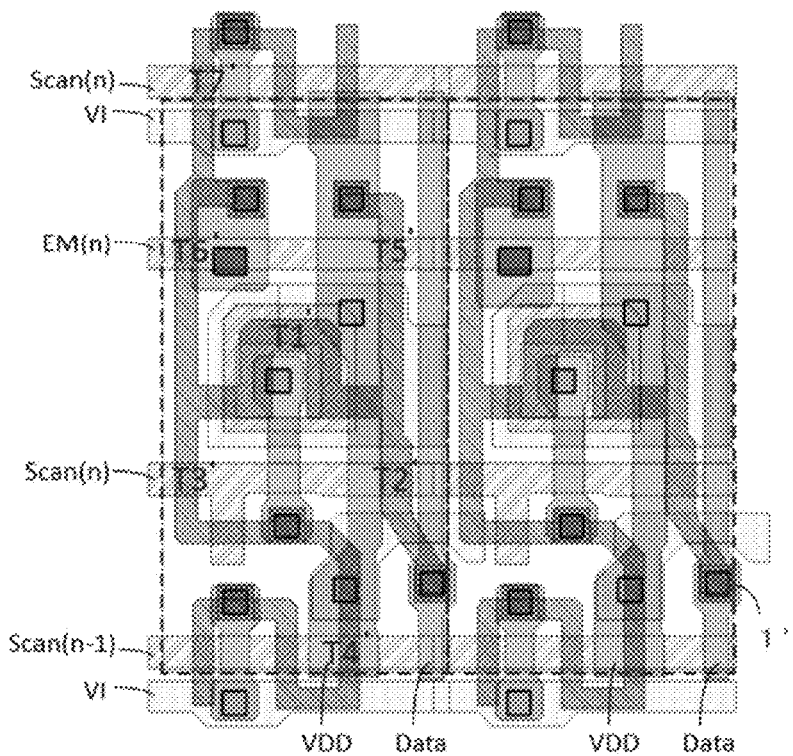
FIG. 6 is a schematic diagram of a structure of a 7T1C circuit of a pixel unit of an AMOLED display panel in the prior art.

Compared with the prior art in which two sub-pixels, namely, a red sub-pixel and a green sub-pixel in a pixel 1 (as shown in FIGS. 2 and 6) are arranged along a direction that a gate line (Scan) extends, such that each of the red and green sub-pixels requires one of data lines Data, and shares the gate line (Scan), additionally, the sub-pixels are longitudinally arranged as a whole. The AMOLED display panel of the present embodiment is achieved by the first sub-pixel 11 and the second sub-pixel 12 in the first pixel unit a share one of the data lines Data, and by the first sub-pixel 11 and the third sub-pixel 13 in the second pixel unit b share one of the data lines Data, such that a quantity of the data lines Data is reduced, thereby reducing a quantity of fan-out wires, and reducing a space required for wiring in a fan-out area, so as to reduce a size of a lower bezel.

Compared with the AMOLED display panel in the prior art, although such disposition of the present embodiment increases a quantity of gate lines, the quantity of data lines Data is reduced by one half, thereby reducing a space required for wiring in a fan-out area, so as to reduce a size of a lower bezel. On the other band, the quantity of gate lines Scan is increased, but if the present disclosure and the prior art use the same driving manner, widths of left and right bezels are increased. Therefore, interlace driving or multi-stage driving may be for gate driver on array (GOA) circuits of two side areas to reduce the widths of the left and right bezels.

The first sub-pixel 11, the second sub-pixel 12 and the third sub-pixel 13 are rectangular and have areas in equal. A direction extending along a long side of each of the first sub-pixel 11, the second sub-pixel 12, and the third sub-pixel 13 is perpendicular to the direction in which the data lines Data extend. In such disposition, the entire structure of the sub-pixel horizontally extend, thereby facilitating the fabrication of a driving transistor in a driving circuit.

Optionally, the first sub-pixel 11 is a green sub-pixel. The second sub-pixel 12 is a blue sub-pixel. The third sub-pixel 13 is a red sub-pixel. Certainly, the first sub-pixel 11, the second sub-pixel 12 and the third sub-pixel 13 may also be other different colors, as long as the colors of the three sub-pixels are different.

In the present embodiment, the pixel structure includes a pixel circuit configured to drive any one of the first sub-pixel 11, the second sub-pixel 12 and the third sub-pixel 13 to emit light. The pixel circuit is one of 7T1C, 6T1C, 6T2C, 5T1C and 4T1C.

Figure 4:
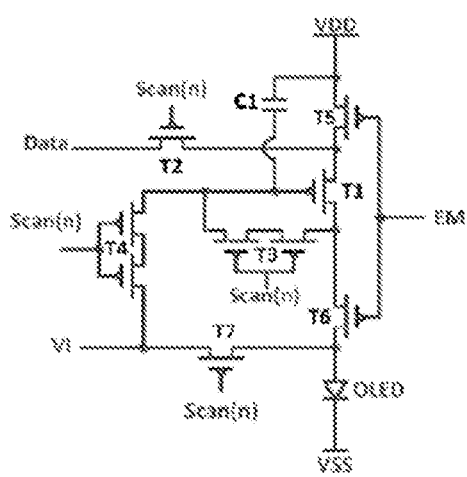
FIG. 4 is a diagram of an equivalent circuit of 7T1C of a sub-pixel of an embodiment of an AMOLED display panel according to the present disclosure.

In the present embodiment, the pixel circuit is a 7T1C pixel circuit, a driving pixel circuit of the first sub-pixel 11 in the first pixel unit a is taken as an example for describing. Referring FIG. 4, the driving pixel circuit includes a driving transistor T1 (a first transistor T1), a second transistor T2, a third transistor T3, a fourth transistor T4, a fifth transistor T5, a sixth transistor T6, a seventh transistor T7, a capacitor C1 and a light-emitting device OLED.

The driving transistor T1 is configured to determine driving current of the pixel driving circuit. The light-emitting device OLED is configured to illuminate to display in response to the driving current. The second transistor T2 is configured to control transmission of a data signal Data. The third transistor T3 is configured to control on and off of a control end and a second end of the driving transistor T1. The fourth transistor T4 is configured to control a reference signal VI transmitted to the control end of the driving transistor T1. The fifth transistor T5 is configured to control a first power signal VDD transmitted to a first end of the driving transistor T1. The sixth transistor T6 is configured to transmit the driving current from the driving transistor T1 to the light-emitting device OLED.

Each of the driving transistor T1, the second transistor T2, the third transistor T3, the fourth transistor T4, the fifth transistor T5, the sixth transistor T6, and the seventh transistor T7 is a PMOS transistor. It should be noted that, each transistor in the pixel driving circuit provided in the present embodiment is a PMOS transistor, thereby preventing a difference between different types of transistors from affecting the pixel driving circuit.

A control end of the fourth transistor T4 is connected to the gate driving signal Scan(n), a first end of the fourth transistor T4 is connected to the reference signal VI, a second end of the fourth transistor T4 is connected to a first end of the third transistor T3, a second end of the capacitor C1, and the control end of the driving transistor T1. The control end of the driving transistor T1 is connected to the second end of the capacitor C1, the second end of the fourth transistor T4 and the first end of the third transistor T3. The first end of the driving transistor T1 is connected to a second end of the second transistor T2 and a first end of the fifth transistor T5. The second end of the driving transistor T1 is connected to a second end of the third transistor T3 and a first end of the sixth transistor T6. A control end of the second transistor T2 is connected to a driving signal Scan(n), and a first end of the second transistor T2 is connected to a data signal Data. A control end of the fifth transistor T5 is connected to a driving signal EM(n). A second end of the fifth transistor is connected to a first end of the capacitor C1 and the first power signal VDD. An anode of the light-emitting device OLED is connected to a second end of the sixth transistor T6. A cathode of the light-emitting device OLED is connected to a second power signal VSS.

The 7T1C pixel circuit includes the driving transistor T1 configured to determine the driving current of the driving circuit.

Figure 5:
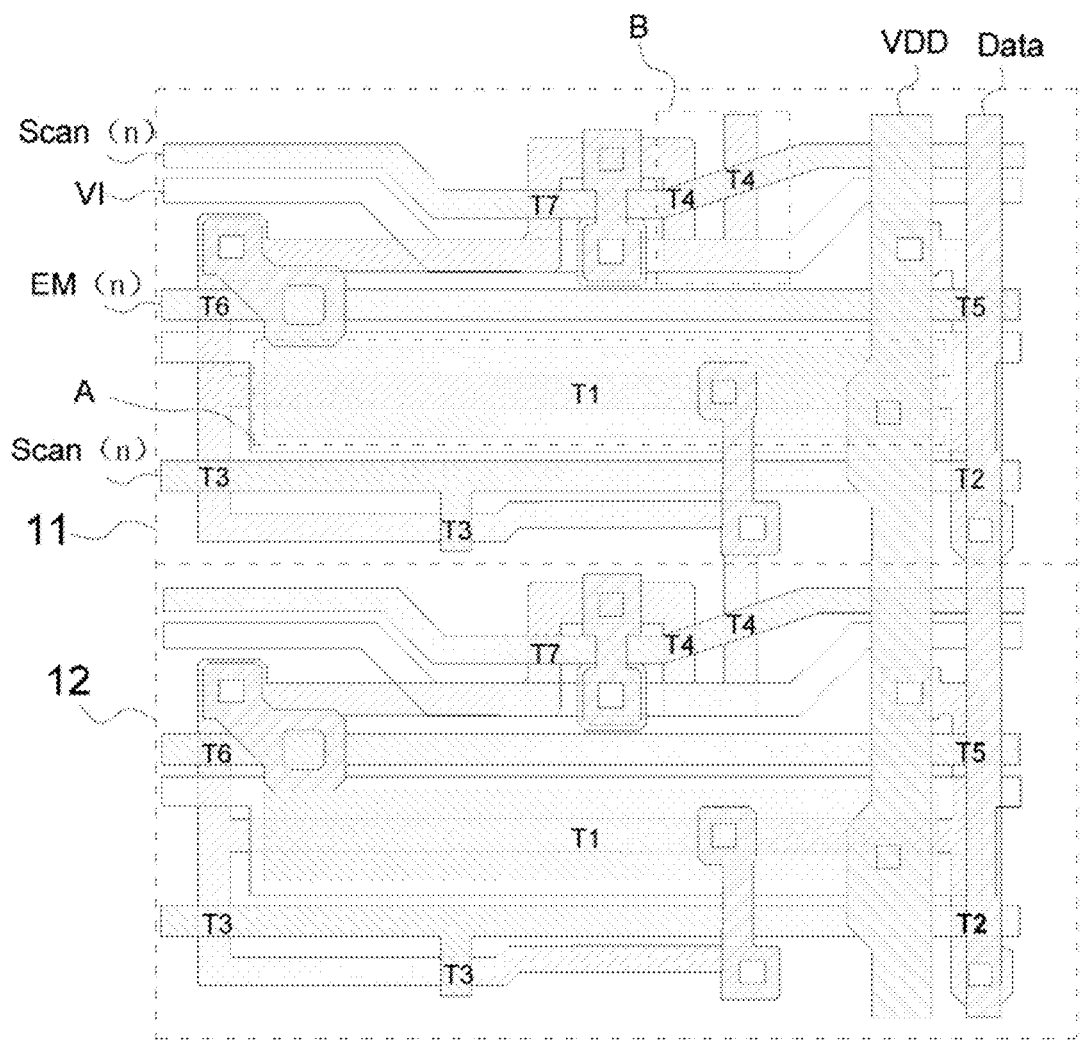
FIG. 5 is a schematic diagram of a structure of a 7T1C circuit of a first pixel unit of an embodiment of an AMOLED display panel according to the present disclosure (circuit structures of the first pixel unit and the second pixel unit are the same)
Figure 7:
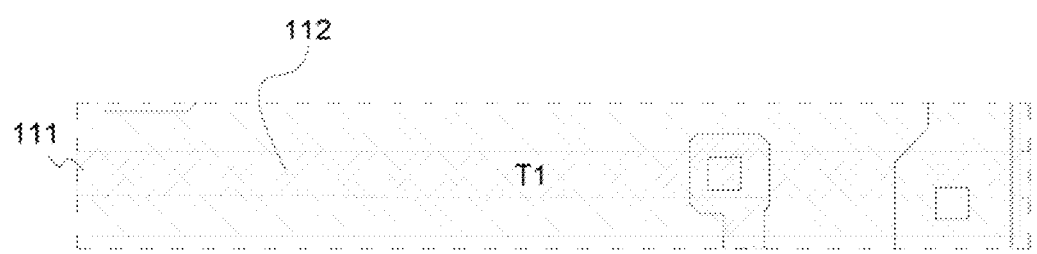
FIG. 7 is an enlarged view of A in FIG. 4.

Referring FIGS. 5 and 7, the driving transistor T1 includes a linear first active layer 111 and a linear first gate 112 disposed on the first active layer 111, the first active layer 111 includes a channel area overlapped with the first gate 112, and the channel area is linear.

Compared with a width of a U-shaped channel area of a driving transistor T1' (as shown in FIG. 6) in a 7T1C circuit structure of a pixel unit of the AMOLED display panel in the prior art, the linear channel area enables a channel width to be more easily controlled, and surface uniformity is better. Because the U-shaped channel has corners, which is more difficult to control a channel width at the corners in a manufacturing process.

Additionally, as shown in FIG. 6, the 7T1C circuit structure in the prior art includes seven transistors, such as thin film transistor T1' to T7', and a capacitor. The capacitor of the 7T1C circuit structure in the prior art is formed by overlapping a first gate metal layer over an active layer of the driving transistor T1' with a second gate metal layer corresponding to the first gate metal layer, and a shape of the capacitor tends to be a square.

In the present embodiment, as shown in FIG. 5, the 7T1C pixel circuit includes a capacitor C1 for voltage compensation. The capacitor C1 includes a straight-strip-shaped lower electrode plate and a straight-strip-shaped upper electrode plate located over the straight-strip-shaped lower electrode plate. The first gate 112 is a portion of the straight-strip-shaped lower electrode plate. Specifically, the capacitor C1 is formed by overlapping a first gate metal layer (upper electrode plate) over the first active layer 111 of the driving transistor T1 with a second gate metal layer (lower electrode plate) corresponding to the first gate metal layer. Moreover, the capacitor C1 of the present embodiment is rectangular. An extending direction of the capacitor C1 and an extending direction of the gate line are the same.

It should be noted that, the first gate metal layer is disposed over the first active layer 111, and the first gate 112 is a portion of the first gate metal layer, wherein a portion of the first gate metal layer overlapping with the first active layer 111 is the first gate 112.

Figure 8:
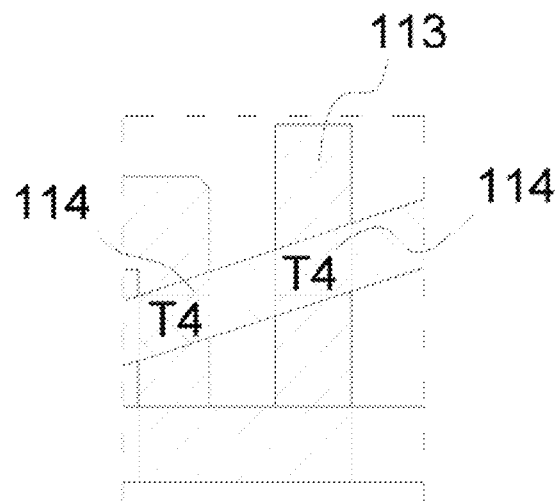
FIG. 8 is an enlarged view of B in FIG. 4.

Referring FIGS. 5 and 8, the 7T1C pixel circuit includes a transistor T4 (the fourth transistor T4) configured to control the reference signal VI transmitted to the control end of the driving transistor.

The transistor T4 includes a U-shaped second active layer 113 and an oblique-line-shaped second gate 114 disposed on the second active layer 113. The second active layer 113 includes two strip-shaped portions disposed in parallel and a connection portion connected to the same end of the two strip-shaped portions. The second gate 114 overlaps with the two strip-shaped portions. The second active layer 113 includes a first channel area in which the second gate 114 obliquely overlaps with one of the strip-shaped portions, and a second channel area in which the second gate 114 obliquely overlaps with the other of the strip-shaped portions, wherein the first channel area and the second channel area are oblique-line-shaped.

The first channel area and the second channel area are disposed as Oblique-line-shape to increases an effective length of the channel area, and then reduces a leakage current.

It should be noted that, the second gate 114 is a portion of the gate line Scan(n), the gate line Scan(n) is disposed above the second active layer 113, and a portion of the gate line Scan(n) overlapping with the second active layer 113 is the second gate 114. Additionally, the first active layer 111 and the second active layer 113 are disposed at a same layer, and the gate line Scan(n) and the first gate 112 are disposed at a same layer.

Additionally, the first sub-pixel includes a substrate, an active layer 11a disposed on the substrate, a first gate metal layer 11b disposed on the active layer 11a, a second gate metal layer 11c disposed on the first gate metal layer 11b, and a source and drain metal layer 11e disposed on the second gate metal layer 11c, wherein the first active layer 111 and the second active layer 113 belong to an active layer, and the gate line Scan(n) and a gate metal unit belong to a first gate layer.

Figure 9A:
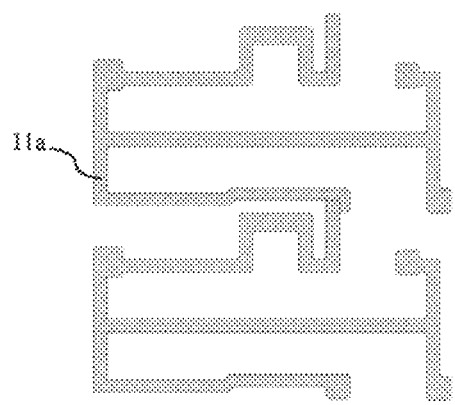
FIGS. 9a to 9f are schematic flowcharts of preparing a circuit structure of a first pixel unit according to the above embodiments.
Figure 9B:
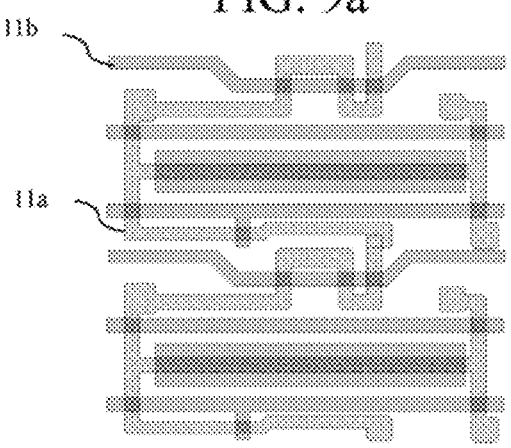
Figure 9C:
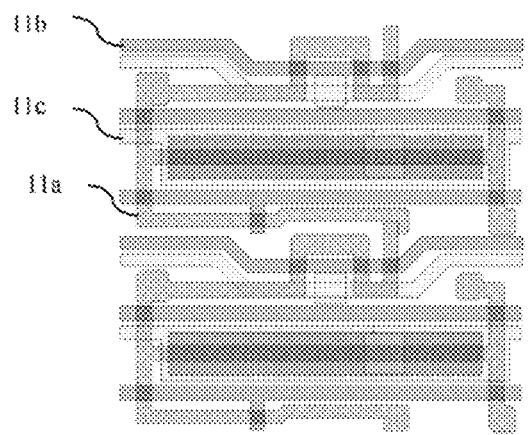
Figure 9D:
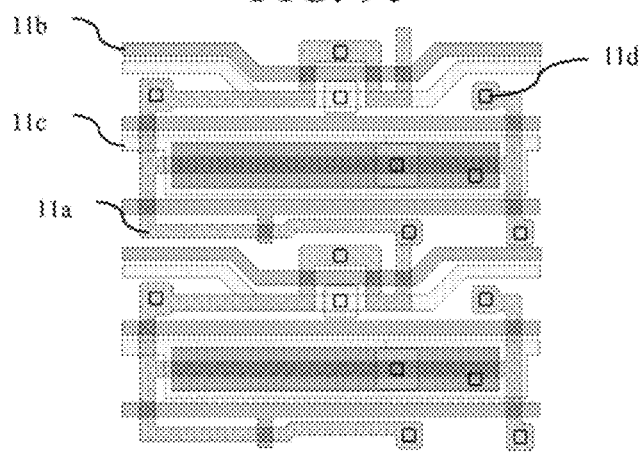
Figure 9E:
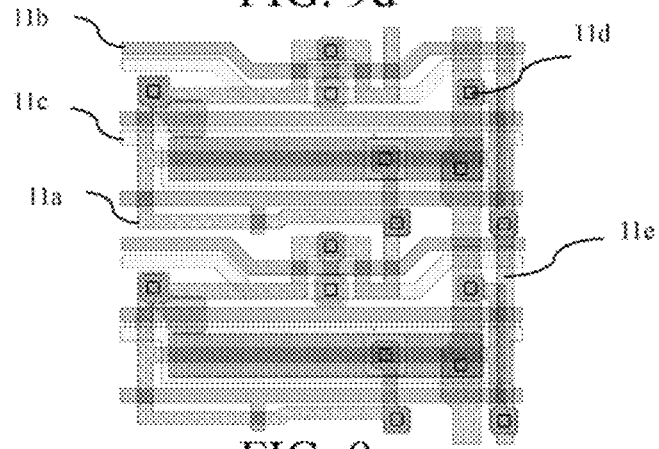
Figure 9F:
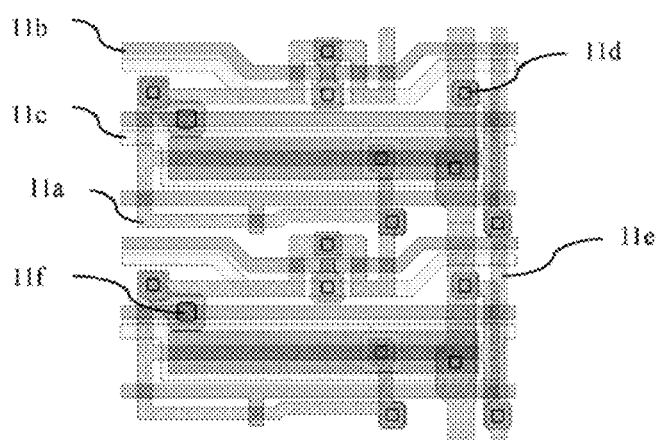

A process of preparing a driving circuit structure of a first pixel unit of the present embodiment is as follows:
forming an active layer 11a on a substrate, wherein the active layer 11a includes a first active layer 111 and a second active layer 113, as shown in FIG. 9a;
forming a first gate metal layer 11b on the active layer 11a, wherein the first gate metal layer 11b includes a first gate 112 and a second gate 114, as shown in FIG. 9b;
forming a second gate metal layer 11c on the first gate metal layer 11b, as shown in FIG. 9c;
forming a dielectric layer on the second gate metal layer 11c, and performing a patterning process to form a dielectric layer via hole 11d, as shown in FIG. 9d;
forming a source and drain metal layer 11e on the dielectric layer, as shown in FIG. 9e; and
forming a planarization layer on the source and drain metal layer 11e, and performing another patterning process to form a planarization layer via hole 11f, as shown in FIG. 9f.

In such manner, the driving circuit structure of the first pixel unit of the present embodiment is completed.

The present disclosure further relates to a display device including an AMOLED display panel, which includes a plurality of first pixel units and a plurality of second pixel units. The first pixel units and the second pixel units are alternately disposed along a horizontal direction and along a vertical direction to form a pixel structure arranged in a matrix manner.

The first pixel unit includes a first sub-pixel and a second sub-pixel disposed side by side with the first sub-pixel. The second pixel unit includes another first sub-pixel and a third sub-pixel disposed side by side with the another first sub-pixel. The first pixel unit and a third sub-pixel adjacent to the second pixel unit constitute a pixel point. The second pixel unit and a second sub-pixel adjacent to the first pixel unit constitute a pixel point.

The pixel structure further includes a plurality of data lines connected to sub-pixels. In the first pixel unit, the first sub-pixel and the second sub-pixel are arranged along a direction in which the data lines extend, and the first sub-pixel and the second sub-pixel share one of the data lines, and in the second pixel unit, the first sub-pixel and the third sub-pixel are arranged along the direction in which the data lines extend, and the first sub-pixel and the third sub-pixel share one of the data lines.

In the display device of the present disclosure, the first sub-pixel, the second sub-pixel, and the third sub-pixel are rectangular and have areas in equal. An extending direction of a long side of each of the first sub-pixel, the second sub-pixel and the third sub-pixel is perpendicular to the extending direction of the data lines.

In the display device of the present disclosure, the pixel structure includes a pixel circuit configured to drive any one of the first sub-pixel, the second sub-pixel and the third sub-pixel to emit light. The pixel circuit is one of 7T1C, 6T1C, 6T2C, 5T1C and 4T1C.

In the display device of the present disclosure, the pixel circuit is a 7T1C pixel circuit. The 7T1C pixel circuit includes a driving transistor configured to determine driving current of a driving circuit.

The driving transistor includes a linear first active layer and a linear first gate disposed on the first active layer. The first active layer includes a channel area overlapped with the first gate, and the channel area is linear.

In the display device of the present disclosure, the 7T1C pixel circuit includes a capacitor for voltage compensation. The capacitor includes a straight-strip-shaped lower electrode plate and a straight-strip-shaped upper electrode plate located over the straight-strip-shaped lower electrode plate. The first gate is a portion of the straight-strip-shaped lower electrode plate.

In the display device of the present disclosure, the pixel circuit is a 7T1C pixel circuit, and the 7T1C pixel circuit includes a transistor configured to control a reference signal VI transmitted to a control end of the driving transistor; wherein the transistor includes a U-shaped second active layer and an oblique-line-shaped second gate disposed on the second active layer, the second active layer includes two strip-shaped portions disposed in parallel, the second gate overlaps with the two strip-shaped portions, the second active layer includes a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

Compared with AMOLED display panels in the prior art, the AMOLED display panel and the corresponding display device of the present disclosure are implemented by the first sub-pixel and the second sub-pixel in the first pixel unit share one of the data lines, and the first sub-pixel and the third sub-pixel in the second pixel unit share one of the data lines, such that a quantity of data lines is reduced, thereby reducing a quantity of fan-out wires, and reducing a space required by wiring in a fan-out area, so as to reduce a size of a lower bezel.

Additionally, when the 7T1C pixel circuit is configured to drive the sub-pixel, the channel area of the driving transistor is linear, thereby reducing a process difficulty. The first channel area and the second channel area of the transistor configured to control the reference signal VI transmitted to a control end of the driving transistor are oblique-line-shaped, thereby increasing an effective length of the channel area and reducing a leakage current. It resolves a technical problem that a "Pentile" pixel arrangement design used in the current AMOLED display panel, in which each pixel requires two data lines, that causes an increase in the quantity of fan-out wires and increases a height required for the fan-out area.

In summary, although the present disclosure is disclosed above as the embodiments, sequence numbers before the embodiments such as "first" and "second" are only for convenience of description, and do not limit an order of the embodiments of the present disclosure. Moreover, the above embodiments are not intended to limit the present disclosure. A person of ordinary skill in the art may make various changes and modifications without departing from the spirit and scope of the present disclosure. Therefore, the protection scope of the present disclosure shall be subject to the scope defined by the claims.

What is claimed is:

1. An active-matrix organic light-emitting diode (AMOLED) display panel, comprising a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit comprises a first sub-pixel and a second sub-pixel disposed side by side with the first sub-pixel; wherein the second pixel unit comprises another first sub-pixel and a third sub-pixel disposed side by side with the another first sub-pixel; wherein the first pixel unit and a third sub-pixel adjacent to the second pixel unit constitute a pixel point, and the second pixel unit and a second sub-pixel adjacent to the first pixel unit constitute a pixel point;

wherein the pixel structure comprises a plurality of data lines connected to sub-pixels; wherein in the first pixel unit, the first sub-pixel and the second sub-pixel are arranged along a direction in which the data lines extend, and the first sub-pixel and the second sub-pixel share one of the data lines; wherein in the second pixel unit, the first sub-pixel and the third sub-pixel are arranged along the direction in which the data lines extend, and the first sub-pixel and the third sub-pixel share one of the data lines;

wherein the first sub-pixel, the second sub-pixel and the third sub-pixel are rectangular and have areas in equal, and a direction extending along a long side of each of the first sub-pixel, the second sub-pixel, and the third sub-pixel is perpendicular to the direction in which the data lines extend; and wherein the pixel structure comprises a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

2. The AMOLED display panel as claimed in claim 1, wherein the pixel circuit is a 7T1C pixel circuit, and the 7T1C pixel circuit comprises a driving transistor configured to determine driving current of a driving circuit; and the driving transistor comprises a linear first active layer and a linear first gate disposed on the first active layer, the first active layer comprises a channel area overlapping with the first gate, and the channel area is linear.

3. The AMOLED display panel as claimed in claim 2, wherein the 7T1C pixel circuit comprises a capacitor for voltage compensation, the capacitor comprises a straight-strip-shaped lower electrode plate and a straight-strip-shaped upper electrode plate located over the straight-strip-shaped lower electrode plate, and the first gate is a part of the straight-strip-shaped lower electrode plate.

4. The AMOLED display panel as claimed in claim 1, wherein the pixel circuit is a 7T1C pixel circuit, and the 7T1C pixel circuit comprises a transistor configured to control a reference signal transmitted to a control end of a driving transistor; and the transistor comprises a U-shaped second active layer and an oblique-line-shaped second gate disposed on the second active layer, the second active layer comprises two strip-shaped portions disposed in parallel, the second gate overlaps with the two strip-shaped portions, the second active layer comprises a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

5. An active-matrix organic light-emitting diode (AMOLED) display panel, comprising a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit comprises a first sub-pixel and a second sub-pixel disposed side by side with the first sub-pixel; wherein the second pixel unit comprises another first sub-pixel and a third sub-pixel disposed side by side with the another first sub-pixel; wherein the first pixel unit and a third sub-pixel adjacent to the second pixel unit constitute a pixel point, and the second pixel unit and a second sub-pixel adjacent to the first pixel unit constitute a pixel point;

wherein the pixel structure further comprises a plurality of data lines connected to sub-pixels; wherein in the first pixel unit, the first sub-pixel and the second sub-pixel are arranged along a direction in which the data lines extend, and the first sub-pixel and the second sub-pixel share one of the data lines; and wherein in the second pixel unit, the first sub-pixel and the third sub-pixel are arranged along the direction in which the data lines extend, and the first sub-pixel and the third sub-pixel share one of the data lines.

6. The AMOLED display panel as claimed in claim 5, wherein the first sub-pixel, the second sub-pixel, and the third sub-pixel are rectangular and have areas in equal, and a direction extending along a long side of each of the first sub-pixel, the second sub-pixel, and the third sub-pixel is perpendicular to the direction in which the data lines extend.

7. The AMOLED display panel as claimed in claim 5, wherein the pixel structure comprises a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

8. The AMOLED display panel as claimed in claim 7, wherein the pixel circuit is a 7T1C pixel circuit, and the 7T1C pixel circuit comprises a driving transistor configured to determine driving current of a driving circuit; and the driving transistor comprises a linear first active layer and a linear first gate disposed on the first active layer, the first active layer comprises a channel area overlapping with the first gate, and the channel area is straight-line-shaped.

9. The AMOLED display panel as claimed in claim 8, wherein the 7T1C pixel circuit comprises a capacitor for voltage compensation, the capacitor comprises a straight-strip-shaped lower electrode plate and a straight-strip-shaped upper electrode plate located over the straight-strip-shaped lower electrode plate, and the first gate is a portion of the straight-strip-shaped lower electrode plate.

10. The AMOLED display panel as claimed in claim 7, wherein the pixel circuit is a 7T1C pixel circuit, and the 7T1C pixel circuit comprises a transistor configured to control a reference signal transmitted to a control end of a driving transistor; and the transistor comprises a U-shaped second active layer and an oblique-line-shaped second gate disposed on the second active layer, the second active layer comprises two strip-shaped portions disposed in parallel, the second gate overlaps with the two strip-shaped portions, the second active layer comprises a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

11. A display device, comprising an active-matrix organic light-emitting diode (AMOLED) display panel, which comprises a plurality of first pixel units and a plurality of second pixel units, wherein the first pixel units and the second pixel units are alternately disposed along a horizontal direction and along a vertical direction to form a pixel structure arranged in a matrix manner;

wherein the first pixel unit comprises a first sub-pixel and a second sub-pixel disposed side by side with the first sub-pixel; wherein the second pixel unit comprises another first sub-pixel and a third sub-pixel disposed side by side with the another first sub-pixel; wherein the first pixel unit and a third sub-pixel adjacent to the second pixel unit constitute a pixel point, and the second pixel unit and a second sub-pixel adjacent to the first pixel unit constitute a pixel point;

wherein the pixel structure further comprises a plurality of data lines connected to sub-pixels; wherein in the first pixel unit, the first sub-pixel and the second sub-pixel are arranged along an extending direction of the data lines, and the first sub-pixel and the second sub-pixel share one of the data lines; and wherein in the second pixel unit, the first sub-pixel and the third sub-pixel are arranged along the extending direction of the data lines, and the first sub-pixel and the third sub-pixel share one of the data lines.

12. The display device as claimed in claim 11, wherein the first sub-pixel, the second sub-pixel, and the third sub-pixel are rectangular and have areas in equal; and an extending direction of a long side of each of the first sub-pixel, the second sub-pixel and the third sub-pixel is perpendicular to the extending direction of the data lines.

13. The display device as claimed in claim 11, wherein the pixel structure comprises a pixel circuit configured to drive any one of the first sub-pixel, the second sub-pixel, and the third sub-pixel to emit light, and the pixel circuit is one of 7T1C, 6T1C, 6T2C, 5T1C, and 4T1C.

14. The display device as claimed in claim 13, wherein the pixel circuit is a 7T1C pixel circuit, and the 7T1C pixel circuit comprises a driving transistor configured to determine driving current of a driving circuit; and the driving transistor comprises a linear first active layer and a linear first gate disposed on the first active layer, the first active layer comprises a channel area overlapping with the first gate, and the channel area is straight-line-shaped.

15. The display device as claimed in claim 14, wherein the 7T1C pixel circuit comprises a capacitor for voltage compensation, the capacitor comprises a straight-strip-shaped lower electrode plate and a straight-strip-shaped upper electrode plate located over the straight-strip-shaped lower electrode plate, and the first gate is a portion of the straight-strip-shaped lower electrode plate.

16. The display device as claimed in claim 13, wherein the pixel circuit is a 7T1C pixel circuit, and the 7T1C pixel circuit comprises a transistor configured to control a reference signal transmitted to a control end of a driving transistor; and the transistor comprises a U-shaped second active layer and an oblique-line-shaped second gate disposed on the second active layer, the second active layer comprises two strip-shaped portions disposed in parallel, the second gate overlaps with the two strip-shaped portions, the second active layer comprises a first channel area in which the second gate obliquely overlaps with one of the strip-shaped portions, and a second channel area in which the second gate obliquely overlaps with the other of the strip-shaped portions, wherein the first channel area and the second channel area are oblique-line-shaped.

* * * * *